United States Patent [19]

Sundstrom

[11] Patent Number: 5,986,496
[45] Date of Patent: Nov. 16, 1999

[54] INTEGRATED CIRCUIT HAVING PROGRAMMABLE BIAS CIRCUITS

[75] Inventor: Lance L. Sundstrom, Pinellas Park, Fla.

[73] Assignee: Honeywell Inc., Minneapolis, Minn.

[21] Appl. No.: 08/865,471

[22] Filed: May 29, 1997

[51] Int. Cl.$^6$ .................................................... G05F 1/10
[52] U.S. Cl. ............................................ 327/543; 327/538
[58] Field of Search ................................. 327/538, 542, 327/530, 543; 323/315

[56] References Cited

U.S. PATENT DOCUMENTS 5,059,890  10/1991  Yoshikawa et al. ................... 323/315
5,276,359  1/1994   Chiang ................................... 307/311
5,319,704  6/1994   Robison ................................. 379/389

*Primary Examiner*—Toan Tran
*Assistant Examiner*—Hai L. Nguyen
*Attorney, Agent, or Firm*—Robert E. Greenstein

[57] ABSTRACT

The present invention utilizes the integrated circuit manufacturing process to produce integrated circuits including bias circuits which implement active devices having uniform gain and gate threshold characteristics. The uniformity of these active devices increases when they are tightly clustered in an integrated circuit chip. Precise linear control of constant current output to a load is realized by maintaining a gate voltage in the linear operating region for a plurality of similarly configured, uniformly fabricated and doped current mirrors.

4 Claims, 2 Drawing Sheets

INTEGRATED CIRCUIT HAVING PROGRAMMABLE BIAS CIRCUITS

This invention was made with Government support under contract F29601-89-C-0084 awarded by the U.S. Department of the Air Force to Honeywell, Inc. and the Government has certain rights in this invention.

TECHNICAL FIELD

The present invention relates to integrated circuits (ICs), and more particularly to integrated circuits having integral bias circuitry.

BACKGROUND OF THE INVENTION

Most digital circuits require undriven inputs to be biased to a valid high or low voltage level. Conventional bias circuitry typically utilizes a fixed pull-up or pull-down resistor or latch that biases an input to its last driven state.

In the case of a fixed bias circuit for a synchronous or clocked system having an intermittent undriven state, e.g., multiple bidirectional cells connected together as a bus, the bias circuit may repeatedly charge a net (an unbroken, conductive medium connecting active and passive devices into a single circuit) from its driven state to a biased state. When the driven and biased states are at opposite logic levels, the transition from the driven state to the biased state exhibits the exponential time response of a simple RC circuit. As the net charges, the current through and voltage across a bias resistor exponentially decreases toward zero. A bias circuit using passive bias resistors may require as many as three time constants to charge a net through the opposite logic threshold, e.g., from a low to a high voltage level.

Pull-up or pull-down biasing functions are often integrated into the input/output (I/O) cells (I/O drivers of an IC on which the bias circuit resides) of application specific integrated circuits (ASICs). However, on-chip resistors used in typical bias circuits have poor tolerances and require more silicon area than transistors. Although transistors can be switched "ON" and "OFF" and use much less silicon area, saturated transistors present an even worse tolerance problem over process, voltage, and temperature.

Therefore, conventional bias circuits present several disadvantages when applied to integrated circuit design. As previously discussed, the time required for a bias circuit to transition from one digital logic state to another is one of the impediments to meeting faster integrated circuit clock speed specifications. Additionally, conventional bias circuits use components which do not promote efficient use of valuable silicon wafer surface area. Further, due to the integrated circuit manufacturing process, the tolerances of conventional bias circuit components are not predictably consistent for close tolerance applications.

DISCLOSURE OF THE INVENTION

An object of the present invention is to provide an integrated circuit having a faster integral bias circuit with uniform output current values.

According to the invention, an integrated circuit comprises a plurality of load driving transistors where each transistor is of a first polarity and is connected to a common power supply to supply load current from the common power supply to an individual load. A first input transistor of a polarity opposite said first polarity has its connected to an input signal terminal. A second input transistor of the first polarity has its connected to said input signal terminal. The input signal terminal receives a signal that turns on the first input transistor and turns off the second input transistor. A diode and a resistor in series provide current to the first input transistor from the common power supply when the first input transistor is turned on. The resistor is selected place the diode in its linear operating region. The base of each of the plurality of load driving transistors is connected to the junction between the diode and the resistor.

According to one aspect of the invention, a capacitor connects the diode's terminals.

According to one aspect of the invention, the current in each of the load driving transistors is proportional to the size of transistor to the size of the diode.

In accordance with another aspect of the present invention, the load driving transistors (i.e., current mirrors) are transistors simultaneously manufactured (fabricated and doped) with the diode.

One feature of the present invention is that it provides continuous linear and digital control of constant current sources within an integrated circuit.

A further feature of the present invention is that it rapidly charges a net thereby providing improved system performance while requiring less power than conventional bias circuits.

Further objects, benefits, and features of the present invention will become apparent to one of ordinary skill in the art from the drawings and description of the best mode for carrying out the invention disclosed within this document.

BEST MODE FOR CARRYING OUT THE INVENTION

Figure 1:
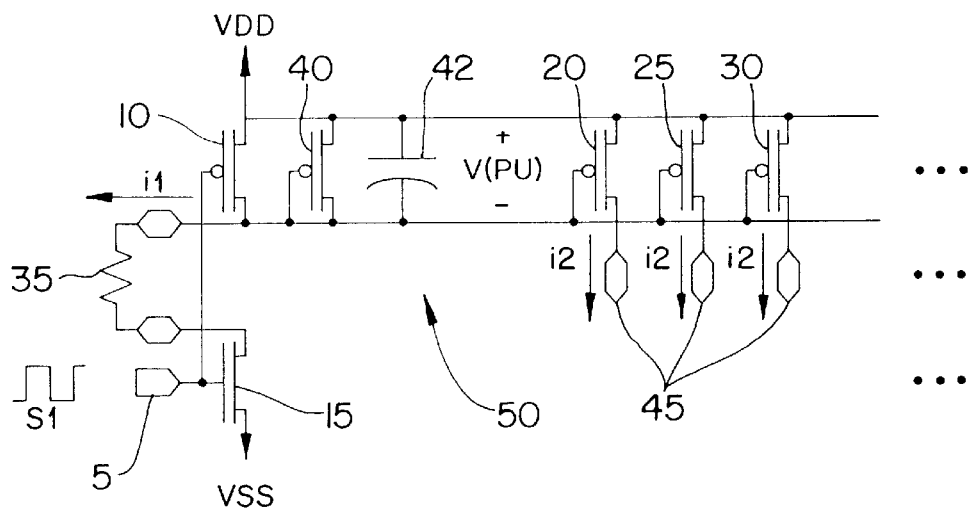
FIG. 1 is a schematic of a pull-up circuit embodying the subject invention.

Referring to FIG. 1, when input node 5 receives a low digital signal, S1, the pull-up bias circuit 50 is disabled, that is a p-channel transistor 10 is "ON" and a n-channel transistor 15 is "OFF." Pull-up bias control voltage, V(PU), is zero therefore, p-channel output pull-up transistors 20, 25, and 30 are also "OFF." However, when S1 is a high digital signal, the pull-up bias circuit 50 is enabled, the p-channel transistor 10 switches "OFF" and the n-channel transistor 15 switches "ON." Subsequently, a reference current, i1, is established through the p-channel diode-connected reference transistor 40, the linear control resistor 35, and the n-channel transistor 15. The reference current i1 is limited by the value of the resistor 35, a discrete component external to the integrated circuit chip. The value of the linear control resistor 35 is selected to establish a bias control voltage, V(PU), across the diode 40. Diode 40 may be any active device capable of diode electrical response, e.g., a diode-connected transistor with the gate connected to the drain. V(PU) is maintained in the linear region of the diode's 40 operating specifications. As reference current i1 through the diode 40 increases, the voltage drop across resistor 35 increases, thereby decreasing V(PU). The diode 40 responds to the V(PU) decrease by restricting the reference current i1 which, in turn, decreases the voltage drop across the resistor 35 and increases V(PU) across the diode 40. This process continues with incrementally smaller changes in current to produce a stable, steady-state reference current i1. Accordingly, the voltage across diode 40 is self-adjusting responsive to the current drawn by resistor 35. A capacitor 42 stabilizes bias voltage V(PU).

Since the gate and the source of the diode 40 and each of the output transistors 20, 25, and 30 are connected in parallel, diode 40 and output transistors 20, 25, and 30 share the same gate-to-source voltage, V(PU). The output transistors 20, 25, and 30 are current mirrors which produce constant current at output nodes 45. As such, the output current i2 available at each output node 45 is constant, has a magnitude proportional to the magnitude of the reference current, i1, and is independent of output voltage until the drain-source voltage differential of the respective current mirrors 20, 25, and 30 approaches zero. The accuracy of the current mirrors 20, 25, and 30 is primarily a function of the relative size, gain, and gate threshold of the diode 40 and the current mirror transistors 20, 25, and 30.

The ratio of the output current i2 of the current mirrors 20, 25, and 30 to the reference current i1 is a linear function of the ratio of the physical size of the respective current mirrors 20, 25, and 30 to the diode 40. If each of the current mirrors 20, 25, and 30 are ten times as large as the diode 40, the resultant magnitude of output current i2 will be ten times as large as the magnitude of the reference current i1. Likewise, if each of the current mirrors 20, 25, and 30 are the same size as diode 40, the resultant magnitude of output current i2 will be the same as the magnitude of the reference current i1.

The diode 40 and the output transistors 20, 25, and 30 have identical electrical response characteristics because they are made of the same semiconductive material. Further, the diode 40 and the output transistors 20, 25, and 30 are tightly clustered to one another in an integrated circuit to minimize deviations in the magnitude of the output current i2 with respect to the magnitude of the reference current i1. Minimizing the physical distance and trace length between active devices 20, 25, 30, and 40 will minimize trace resistance which may cause V(PU) variations at the respective current mirrors 20, 25, and 30 and resultant variations in the output current i2 at output nodes 45. Precise control of the current mirror output current i2 is achieved by operating each of the active components 20, 25, 30, and 40 within its linear region by selecting a value of the resistor 35 to maintain the gate voltage V(PU) in the linear region of the active devices 20, 25, 30, and 40 as previously described.

The number of current mirrors available for any given pull-up bias circuit is application dependent. Three current mirrors 20, 25, and 30 are utilized here for purposes of illustrating the operation of a circuit implementing the subject invention. However, it should be obvious to one of ordinary skill in the art that the quantity of current mirrors may either be increased or decreased to meet the needs of a given application.

Although FIG. 1 depicts the pull-up embodiment utilizing CMOS devices, it should be obvious to one of ordinary skill in the art that the same embodiment may be carried out with similar results using FET or bipolar components as well.

Figure 2:
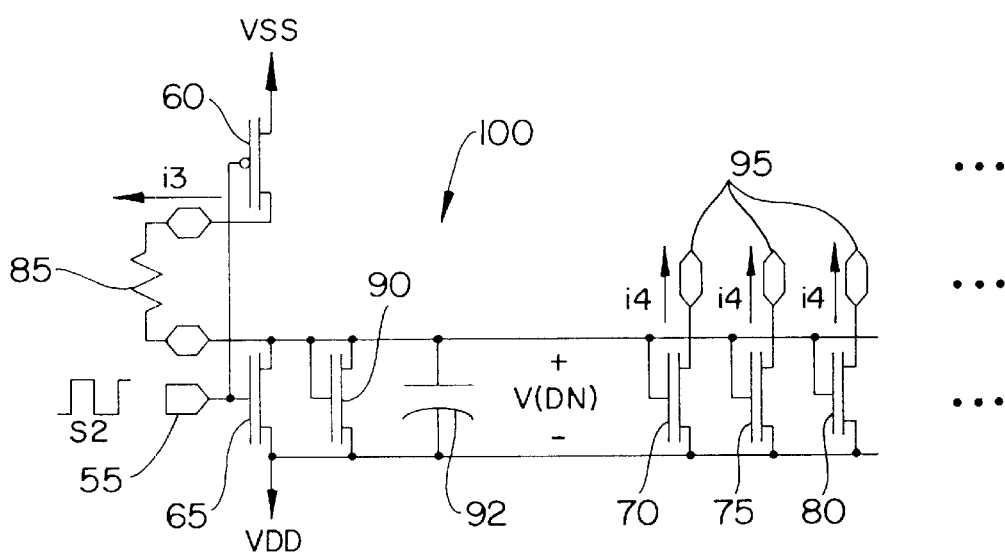
FIG. 2 is a schematic of a pull-down circuit embodying the subject invention.

Referring to FIG. 2, when input node 55 receives a high digital signal, S2, the pull-down bias circuit 100 is disabled, that is a p-channel transistor 60 is "OFF" an a n-channel transistor 65 is "ON." Pull-down bias control voltage, V(DN), is zero, therefore, n-channel output pull-down transistors 70, 75, and 80 are also "OFF." However, when S2 is a low digital signal, the pull-down bias circuit 100 is enabled, the p-channel transistor 60 switches "ON" and the n-channel transistor 65 switches "OFF." Subsequently, a reference current i3 is established through the n-channel diode-connected reference transistor 90, the linear control resistor 85, and the p-channel transistor 60. The reference current i3 is limited by the value of the resistor 85, a discrete component external of the integrated circuit chip. The value of the linear control resistor 85 is selected to establish a bias control voltage, V(DN), across the diode 90. Diode 90 may be any active device capable of diode electrical response, e.g., a diode-connected transistor with the gate connected to the drain. V(DN) is maintained, in the linear region of the diode's 90 operating specifications. As the reference current i3 through the diode 90 increases, the voltage drop across resistor 85 increases, thereby decreasing V(DN). The diode 90 responds to the V(DN) decrease by restricting the reference current i3 which, in turn, decreases the voltage drop across the resistor 85 and increases V(DN) across the diode 90. This process continues with incrementally smaller changes in current to produce a stable, steady-state reference current i3. Accordingly, the voltage across diode 90 is self-adjusting responsive to the current drawn by resistor 85. A capacitor 92 stabilizes bias voltage V(DN).

Since the gate and source of the diode 90 and each of the output transistors 70, 75, and 80 are connected in parallel, diode 90 and output transistors 70, 75, and 80 share the same gate-to-source voltage, V(DN). The output transistors 70, 75, and 80 are current mirrors which produce constant current at output nodes 95. As such, the output current i4 available at each output node 95 is constant, has a magnitude proportional to the magnitude of the reference current, i3, and is independent of output voltage until the drain-source voltage differential of the respective current mirrors 70, 75, and 80 approaches zero. As with the pull-up embodiment, the accuracy of the current mirrors 70, 75, and 80 is primarily a function of the relative size, gain, and gate threshold of the diode 90 and the current mirror transistors 70, 75, and 80.

The ratio of the output current i4 of the current mirrors 70, 75, and 80 to the reference current i3 is a linear function of the ratio of the physical size of the respective current mirrors 70, 75, and 80 to the diode 90. If each of the current mirrors 70, 75, and 80 are ten times as large as the diode 90, the resultant magnitude of output current i4 will be ten times as large as the magnitude of the reference current i3. Likewise, if each of the current mirrors 70, 75, and 80 are the same size as diode 90, the resultant magnitude of output current i4 will be the same as the magnitude of the reference current i3.

The diode 90 and the output transistors 70, 75, and 80 have identical electrical response characteristics because they are made of the same semiconductive material. Further, the diode 90 and the output transistors 70, 75, and 80 are tightly clustered to one another in an integrated circuit to minimize deviations in the magnitude of the output current i4 with respect to the magnitude of the reference current i3. Minimizing the physical distance and trace length between active devices 70, 75, 80, and 90 will minimize trace resistance which may cause V(DN) variations at the respective current mirrors 70, 75, and 80 and resultant variations in the output current i4 at output nodes 95. Precise control of the current mirror output current i4 is achieved by operating each of the active components 70, 75, 80, and 90 within its linear region by selecting a value of resistor 85 to maintain the gate voltage V(DN) in the linear region of the active devices 70, 75, 80, and 90 as previously described.

The number of current mirrors available for any given pull-down bias circuit is application dependent. Three current mirrors 70, 75, and 80 are utilized here for purposes of illustrating the operation of a circuit implementing the subject invention. However, it should be obvious to one of ordinary skill in the art that the quantity of current mirrors may either be increased or decreased to meet the needs of a given application.

Although FIG. 2 depicts the pull-down embodiment utilizing CMOS devices, it should be obvious to one of ordinary skill in the art that the same embodiment may be carried out with similar results using FET or bipolar components as well.

Figure 3:
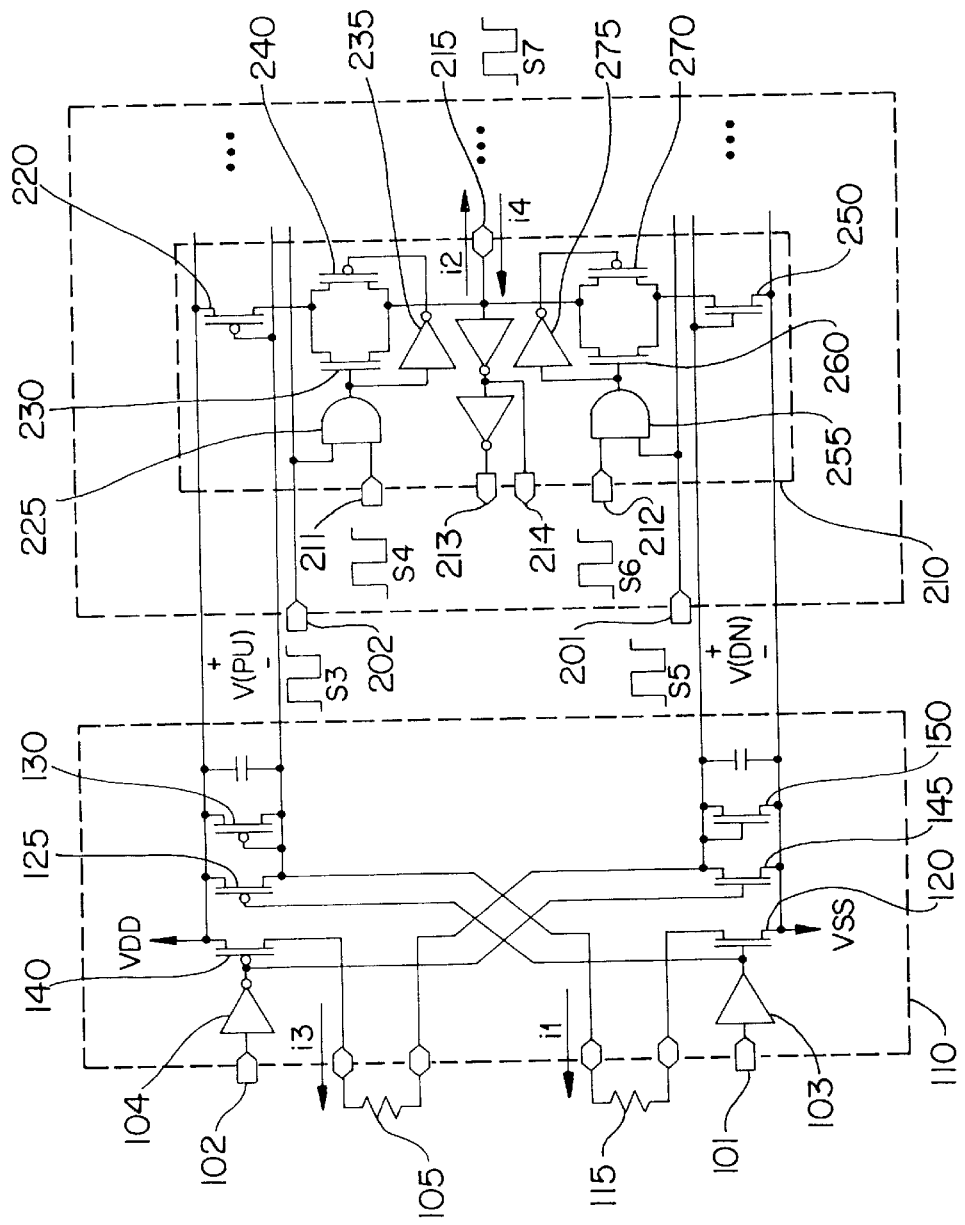
FIG. 3 is a schematic of a hybrid embodiment of the subject invention utilizing controllable gates to selectively operate the circuit in a pull-up, pull-down, or ring-latch mode.

Referring to FIG. 3, the values of external linear control resistors 115 and 105 determine the magnitude of the respective reference currents, i1 and i3, and bias control voltages, V(PU) and V(DN), developed by common bias strength control circuit 110. The digital inputs 101 and 102 permit independent switching control of the respective pull-up and pull-down bias circuit active states.

Consistent with the operation of the pull-up configuration, the pull-up reference current i1 in the hybrid embodiment is controlled by pull-up linear control resistor 115, pull-up input 101, n-channel transistor 120, p-channel transistor 125, and pull-up diode 130. The operation of this phase of the hybrid configuration is identical to the operation of the pull-up configuration previously described. Although output current mirror 220 is not shown grouped with the common bias strength control circuit 110, output current mirror 220 is tightly clustered with diode 130 in actual application to provide the advantages as previously discussed for the pull-up embodiment.

Consistent with the operation of the pull-down configuration shown in FIG. 2, the pull-down reference current i3 in the hybrid embodiment is controlled by pull-down linear control resistor 105, pull-down input 102, p-channel transistor 140, n-channel transistor 145, and pull-down diode 150. The operation of this phase of the hybrid configuration is identical to the operation of the pull-down configuration previously described. Although output current mirror 250 is not shown grouped with the common bias strength control circuit 110, output current mirror 250 is tightly clustered with diode 150 in actual application to provide the advantages as previously discussed for the pull-down embodiment.

Group digital inputs 201 and 202 allow independent control of the pull-up and pull-down bias active state for discrete bias configuration control circuit 210. The discrete digital inputs 211 and 212 and outputs 213 and 214 allow the bias configuration control circuit 210 to be configured in either a pull-up, pull-down, or ring-latch mode. For bias circuit output node 215 to be active in the pull-up mode, i.e., providing i2 to a load, output current mirror 220 must be active. However, unless pass transistors 230 and 240 are also active, the current output available at node 215 will be zero. When group digital input 202 and discrete digital input 211 receive respective high digital signals, S3 and S4, the output of pull-up AND gate 225 transitions to a high digital state and pass transistor 230 switches "ON." Inverting buffer 235 inverts the signal from the pull-up AND gate 225 thereby switching pass transistor 240 "ON." Pull-up output current i2 then passes from output current mirror 220 through pass transistors 230 and 240 and is available at output 215. For bias circuit output node 215 to be active in the pull-down mode, i.e., drawing i4 from a load, output current mirror 250 must be active. However, unless pass transistors 260 and 270 are also active, the current output available at node 215 will be zero. When group digital input 201 and discrete digital input 212 receive respective high digital signals, S5 and S6, the output of pull-up AND gate 255 transitions to a high digital state, pass transistor 260 switches "ON." Inverting buffer 275 inverts the signal from the pull-down AND gate 255 thereby switching pass transistor 270 "ON." Pull-down output current i4 then passes from output current mirror 250 through pass transistors 260 and 270 and is available at output 215.

In the ring-latch configuration, nodes 214 and 212 are connected and nodes 213 and 211 are connected. When node 215 receives a high digital signal S7 and node 202 is high, the pull-up configuration is enabled by the activation of pass transistors 230 and 240. The pull-down configuration is disabled by deactivation of pass transistors 260 and 270. When node 215 receives a low digital signal S7 and node 201 is high, the pull-down configuration is activated by pass transistors 260 and 270. The pull-up configuration is disabled by deactivation of pass transistors 230 and 240. Once S7 is applied to node 215 and subsequently removed, node 215 remains biased to the state at which it was driven by S7.

Although FIG. 3 depicts the hybrid embodiment utilizing CMOS devices, it should be obvious to one of ordinary skill in the art that the same embodiment may be carried out with similar results using FET or bipolar components as well.

With the benefit of the previous discussion of the invention, one of ordinary skill in the art may be able to modify the invention, and the functions and functional elements described above, in whole or in part without departing from the true scope and spirit of the invention.

I claim:

1. An integrated circuit, characterized by:
   a plurality of load driving transistors where each transistor is of a first polarity and is connected to a common power supply to supply load current from the common power supply to an individual load;
   a first input transistor of a polarity opposite said first polarity the base of the first input transistor being connected to an input signal terminal;
   a second input transistor of said first polarity, a first terminal of the second input transistor being connected to the common power supply and a second terminal of the second input transistor being connected to the base of each of said plurality of load transistors, the base of the second input transistor also being connected to said input signal terminal, said input signal terminal receiving a signal that turns on the first input transistor and turns off the second input transistor;
   a diode; and
   a resistor;
   the diode and resistor being in a series to provide current to the first input transistor from the common power supply when the first input transistor is turned on, the resistor being selected place the diode in its linear operating region; and
   the base of each of said plurality of load transistors being connected to the junction between the diode and the resistor.

2. The integrated circuit described in claim 1, further characterized by:
   a capacitor across said diode.

3. The integrated circuit described in claim 1, further characterized in that:
   the ratio of the load current to current in the diode is proportional to the size of each transistor in said plurality of transistors to the size of the diode.

4. The integrated circuit described in claim 1, further characterized in that:
   the diode and each of said plurality of transistors fabricated simultaneously on the same substrate.

* * * * *